(12) United States Patent
Carroll

(10) Patent No.: US 7,336,120 B1
(45) Date of Patent: Feb. 26, 2008

(54) CIRCUIT AND METHOD FOR BOOSTING OUTPUT CURRENT

(75) Inventor: Kenneth J. Carroll, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 322 days.

(21) Appl. No.: 11/127,837

(22) Filed: May 11, 2005

(51) Int. Cl.
*H03K 17/96* (2006.01)
(52) U.S. Cl. .................. 327/517; 327/89; 323/315
(58) Field of Classification Search ........ 323/312–316, 323/299, 264, 274, 277, 273; 330/257, 258, 330/288, 286, 265; 307/277, 276.8; 327/517, 327/58, 89, 545, 530
See application file for complete search history.

(56) References Cited

U.S. PATENT DOCUMENTS

| | | | |
|---|---|---|---|
| 4,560,921 A * | 12/1985 | Yamatake .............. | 323/316 |
| 6,046,577 A | 4/2000 | Rincon-Mora et al. ..... | 323/282 |
| 6,204,654 B1 * | 3/2001 | Miranda et al. ........... | 323/316 |
| 6,809,590 B1 | 10/2004 | Wong et al. .............. | 330/265 |

* cited by examiner

*Primary Examiner*—Rajnikant B. Patel

(57) ABSTRACT

The circuit has an output stage comprising a current source and a current sink. The circuit also has a comparison stage operable to compare a current mirrored from the current source with a current mirrored from the current sink to determine a difference therebetween. The mirrored currents may be a fraction of their corresponding output currents. Moreover, the fractions may be different from each other. A first current boost stage in the circuit is operable to provide a controlled current boost to the output stage if the difference between the compared currents crosses a threshold. The current boost may be a current sink boost or a current source boost.

18 Claims, 8 Drawing Sheets

CIRCUIT AND METHOD FOR BOOSTING OUTPUT CURRENT

TECHNICAL FIELD

Embodiments of the present invention generally pertain to the field of electronic circuits. More particularly, embodiments of the present invention are related to techniques for boosting an output current of an electronic circuit.

BACKGROUND ART

Within the field of electronic circuits there is often a need for a current boost to either a current source or a current sink. For example, circuits that require a low supply voltage may employ an output stage designed to work well with low supply voltages, but that may suffer from limited output current.

FIG. 1 depicts a typical emitter follower (or common collector) output stage, which may not be suitable for low voltage applications. The output voltage swing is limited by the base to emitter voltage drop of each output transistor. Thus, the voltage swing is limited by about 1.4 volts. For applications that can use a relatively large voltage source, the Vbe voltage drops do not pose a problem. However, some applications require a lower voltage source. For example, battery powered application may only have about 1.8 volts between the positive and negative voltage supply. This would leave a maximum voltage swing of only 0.4 volts, which may be unacceptably low. Furthermore, other circuit elements (not depicted in FIG. 1) may also impact the possible voltage swing.

To achieve a higher output voltage swing, a common emitter output stage may be used to achieve what is referred to as a rail-to-rail output. In a similar fashion, a common source configuration may be used for field effect transistors. Referring to FIG. 2, the voltage drop from the collector to the emitter can be on the order of tens of millivolts when the transistor is in saturation (Vce(sat)). This allows the output node to swing between almost the entire range of the positive and negative voltage supply nodes, hence the term rail-to-rail configuration.

The common emitter (or common source) configuration provides nearly the widest voltage swing possible in terms of the voltage supply, and is thus desirable for low voltage supply applications. However, even with this configuration, the very low supply voltage may limit the output current sourced and/or sunk. For example, when the load resistance "Rload" is small, the circuit must source (or sink) a large current. However, this may require a larger base-to-emitter voltage (Vbe) than is possible given the low supply voltage. To illustrate this, for every 60 mV change in Vbe, the collector current, and hence output current, may change by a factor of about ten. Depending on device fabrication, when Vbe is about 0.7 V, the output current may be on the order of 10 micro-amperes. For the collector current to reach 10 milli-amperes, Vbe may need to be about 0.86 V. However, even this relatively small change in Vbe may not be possible given a low supply voltage along with various elements other than the output transistors (not shown in FIG. 2) having voltage drops.

Thus, there is a need to provide a current boost to a circuit. While a current boost may be valuable to a common-emitter output stage, those of ordinary skill in the art will appreciate that this need is not limited to such configurations. For example, the circuit of FIG. 1 may benefit from a current boost in some applications. Also circuits employing field effect devices may benefit from a current boost.

SUMMARY

The present invention provides a method and circuit that provide a current boost to an electronic circuit. Embodiments of the present invention provide a current source boost and/or a current sink boost. Embodiments of the present application are suitable for low supply voltage applications.

A method and circuit for providing a current boost is disclosed. In one embodiment, a current source of an output stage is compared to a current sink of the output stage to determine a difference therebetween. If the difference crosses a threshold, a controlled current boost is provided to the output. The controlled current boost may be a current sink boost or a current source boost.

Another embodiment in accordance with the present invention is a circuit that is able to provide a current boost. The circuit has an output stage comprising a current source and a current sink. The circuit also has a comparison stage operable to compare a current mirrored from the current source with a current mirrored from the current sink to determine a difference therebetween. The mirrored currents may be a fraction of their corresponding output currents. Moreover, the fractions may be different from each other. A first current boost stage in the circuit is operable to provide a controlled current boost to the output stage if the difference between the compared currents crosses a threshold. The current boost may be a current sink boost or a current source boost.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 1:
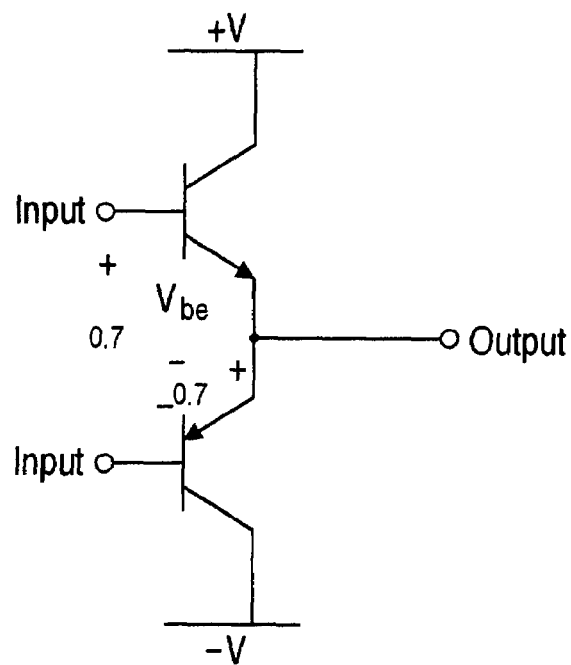
FIG. 1 depicts a conventional emitter follower configuration.
Figure 2:
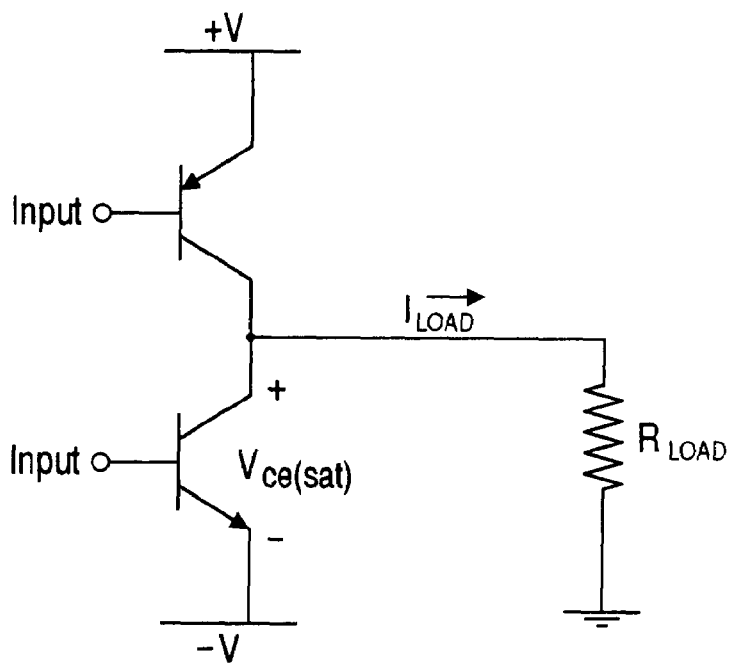
FIG. 2 depicts a conventional common emitter configuration used for a rail-to-rail output stage.
Figure 3A:
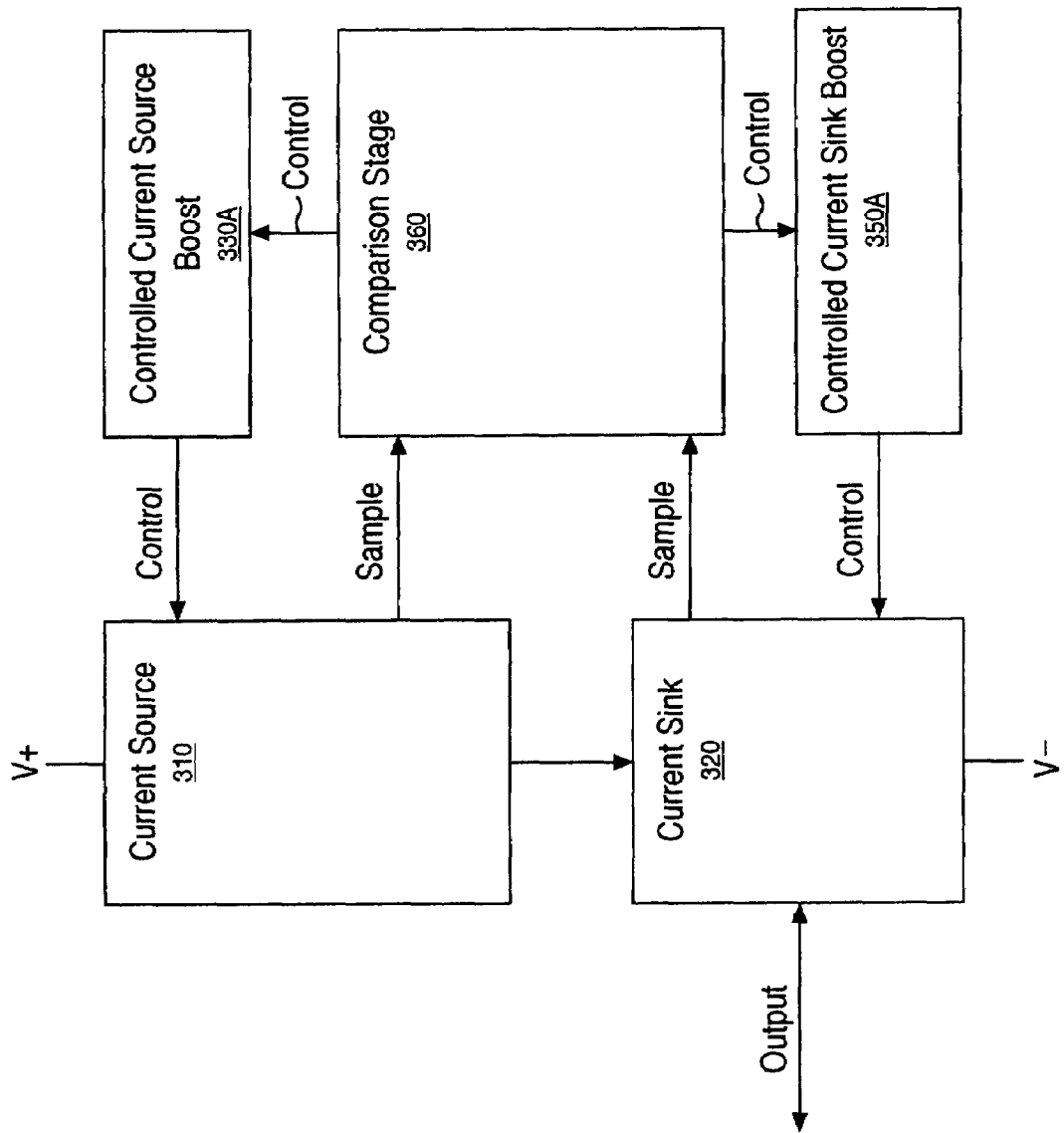
FIG. 3A and FIG. 3B depict block diagrams of circuits using controlled positive feedback for boosting a current, in accordance with embodiments of the present invention.

FIG. 3A depicts a block diagram of a circuit using controlled positive feedback for boosting a current, in accordance with an embodiment of the present invention. The current source 310 and the current sink 320 are part of an output stage. The comparison stage 360 samples a current from the current source 310 and the current sink 320 and controls the limited current source boost 330a and the limited current sink boost 350a based on the comparison. In this embodiment, the limited current source boost 330a sends a control signal to the current source 310 when a current boost is desired, causing the current source to provide additional current. In a similar fashion, the limited current sink boost 350a sends a control signal to the current sink 320 when a current boost is desired, causing the current sink to sink additional current.

The circuit of FIG. 3A uses positive feedback, wherein the current boost is provided to the output element (310 or 320) having the greater current. For example, if the comparison stage 360 determines that the current source 310 is greater than current sink 320 by more than a certain amount, the current source 310 is boosted. Moreover, the current boost is increased for greater differences between the current source and sink, at least up to a point. Because positive feedback is used, the current boost is limited to prevent too high of a current in the current source 310. In a similar fashion, the current sink boost 350a is limited to prevent an undesirably high current in the current sink 320.

As an alternative design to the embodiment depicted in FIG. 3A, either the limited current source boost 330 or the limited current sink boost may be eliminated. For example, in some cases, only a current source boost or a current sink boost is desired.

Figure 3B:
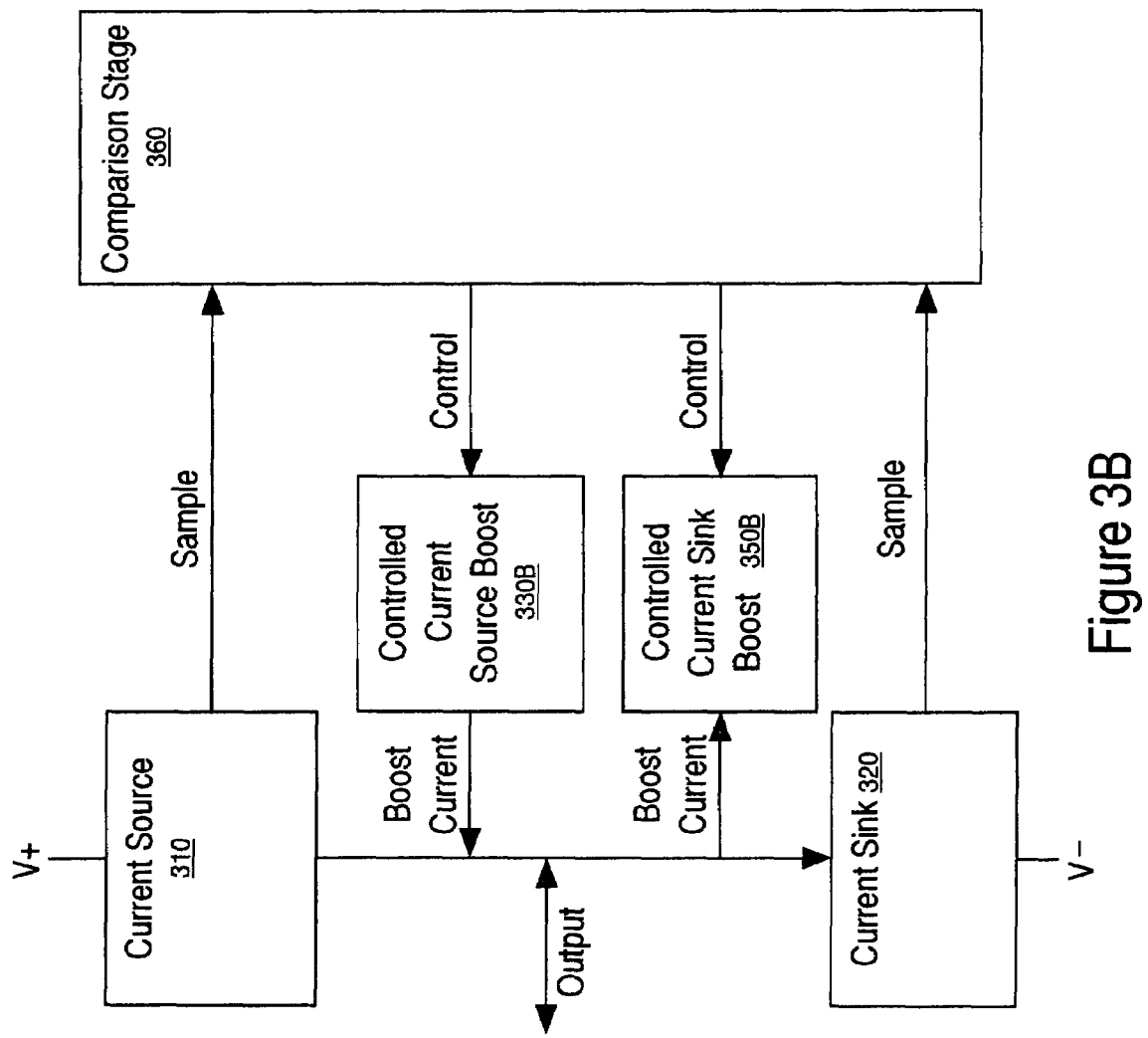

FIG. 3B depicts a block diagram of a circuit using controlled positive feedback for boosting a current, in accordance with an embodiment of the present invention. In this embodiment, the current source boost 330b and the current sink boost 350b provide a current boost directly to the output. The comparison stage 360 samples and compares the current source 310 and the current sink 320 in a similar fashion as the embodiment of FIG. 3A.

As an alternative design to the embodiment depicted in FIG. 3B, either the limited current source boost 330b or the limited current sink boost 350b may be eliminated. Still other embodiments may combine certain elements of FIG. 3A with those of FIG. 3B. For example, the embodiment of FIG. 3B may be modified by replacing the current source boost 330b with the current source boost 330a of FIG. 3A. Alternatively, the current sink boost 350b of FIG. 3B may be replaced with the current sink boost 350a of FIG. 3A.

Figure 4A:
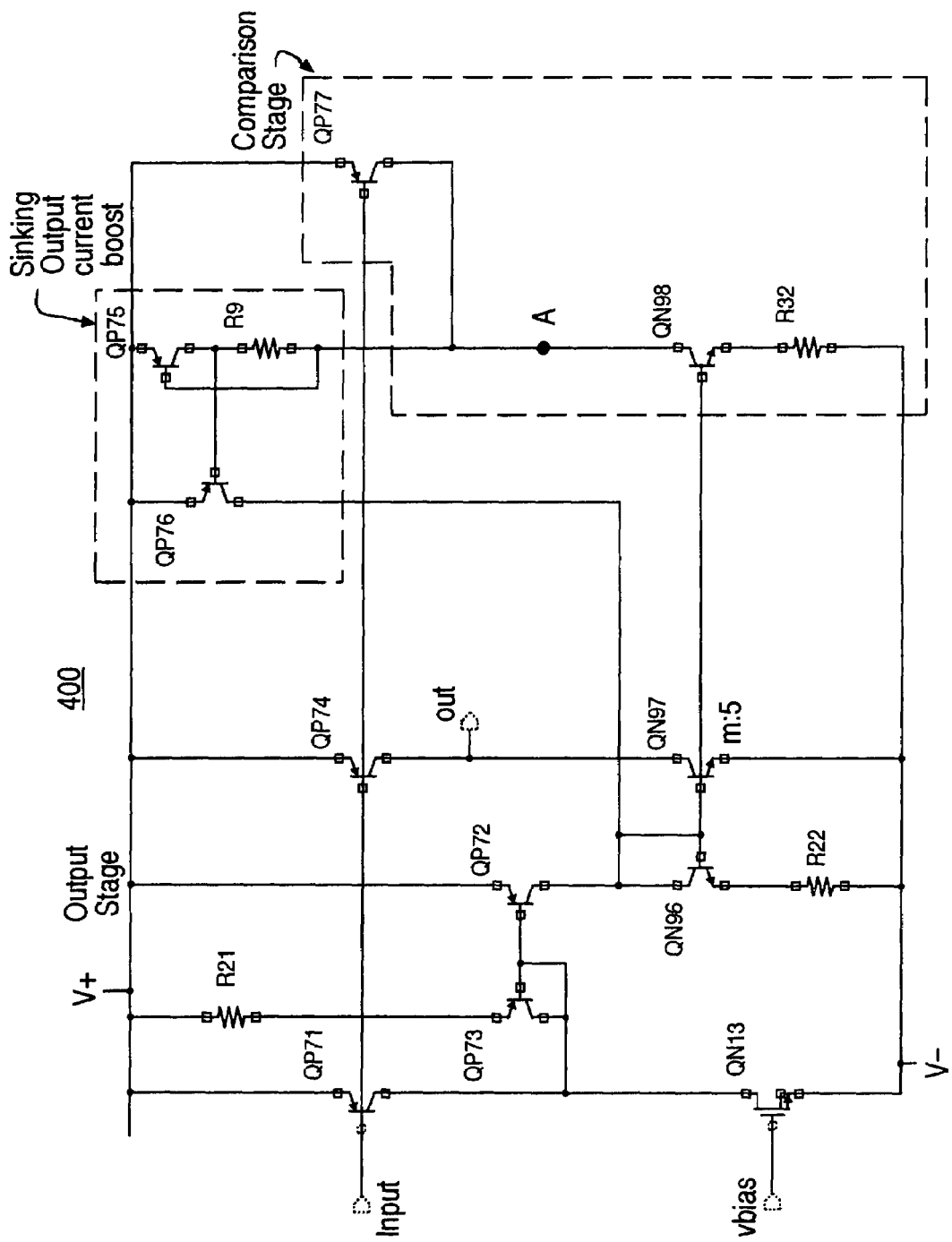
FIG. 4A is a schematic diagram of a circuit that is operative to provide a current sink boost, in accordance with an embodiment of the present invention.

FIG. 4A is a schematic diagram of a circuit 400 that is operative to provide a current sink boost, in accordance with an embodiment of the present invention. The output stage comprises transistors QN96, QN97 and QP74. In this embodiment, transistor QP74 sources the output current. Transistor QP74 is a voltage driven device and has its base coupled to an input stage. Transistor QP71 and bias transistor MN13 are also shown. Output transistor QN97 is a current driven device that sinks the output current. The combination of transistors QP72 and QP73 and resistor R21 are coupled to QN96 to provide the drive current.

A comparison stage comprises transistors QN98 and QP77. Sense transistor QN98 mirrors a fraction of the current from output transistor QN97 by being sized smaller than QN97 and having degenerate resistor R32 coupled from its emitter to ground. Sense transistor QP77 mirrors a fraction of the current from output transistor QP74 by being sized smaller than QP74. The collector of QP77 is coupled in series with the collector of sense transistor QN98 to allow QN98 and QP77 to sample and compare the magnitude of current sourced and current sunk by QP74 and QN97 in order to control a current sink boost stage formed by transistors QP75 and QP76 and resistor R9.

Sense transistor QP77 is designed to mirror a higher fraction of the current from output transistor QP74 than the fraction of the output current from Q97 that is mirrored by sense transistor Q98. Thus, under quiescent conditions, which occur under zero and light load conditions, the collector current of sense transistor QP77 is greater than the collector current of sense transistor QN98. This means that node A tends to go high and there is no current for the current boost stage formed by transistors QP75 and QP76 and resistor R9.

When the output stage is sinking a current, the current in output transistor QN97 will be greater than the current in output transistor QP74 in order to satisfy the load requirement. As previously discussed, the current in sense transistor QP77 is greater than the collector current of sense transistor QN98 at quiescent conditions. However, if the current of output transistor QN97 is greater than the current of output transistor QP74 by a large enough margin, then the current in sense transistor QN98 will be greater than the collector current of sense transistor QP77. The point at which this occurs depends on the ratio of output transistor QP74 to sense transistor QP77 compared to the ratio of output transistor QN97 to sense transistor QN98 factoring in degeneration resistor R32.

When the current in sense transistor QN98 is greater than the collector current of sense transistor QP77, the current sink boost stage turns on. That is, a current flows in transistor QP75 that is in series with QN98. Boost transistor QP76 has its collector coupled to the bases of the current drive output transistor pair QN96 and QN97. Thus, boost transistor QP76 provides a base current boost for the output transistors QN96 and QN97 causing output transistor QN97 to sink more current.

The amount of current boost increases with greater increases in the difference between the currents in output transistors QP74 and QN97. The current sink boost stage is a peaking current source in this embodiment such that the positive feedback loop is controlled. The current of boost transistor QP76 will increase at first as the current at its base increases. However, the current of boost transistor QP76 will peak and then decrease with further increases in its input current. Thus, the sinking boost current is limited to prevent conditions such as latching or oscillation.

Figure 4B:
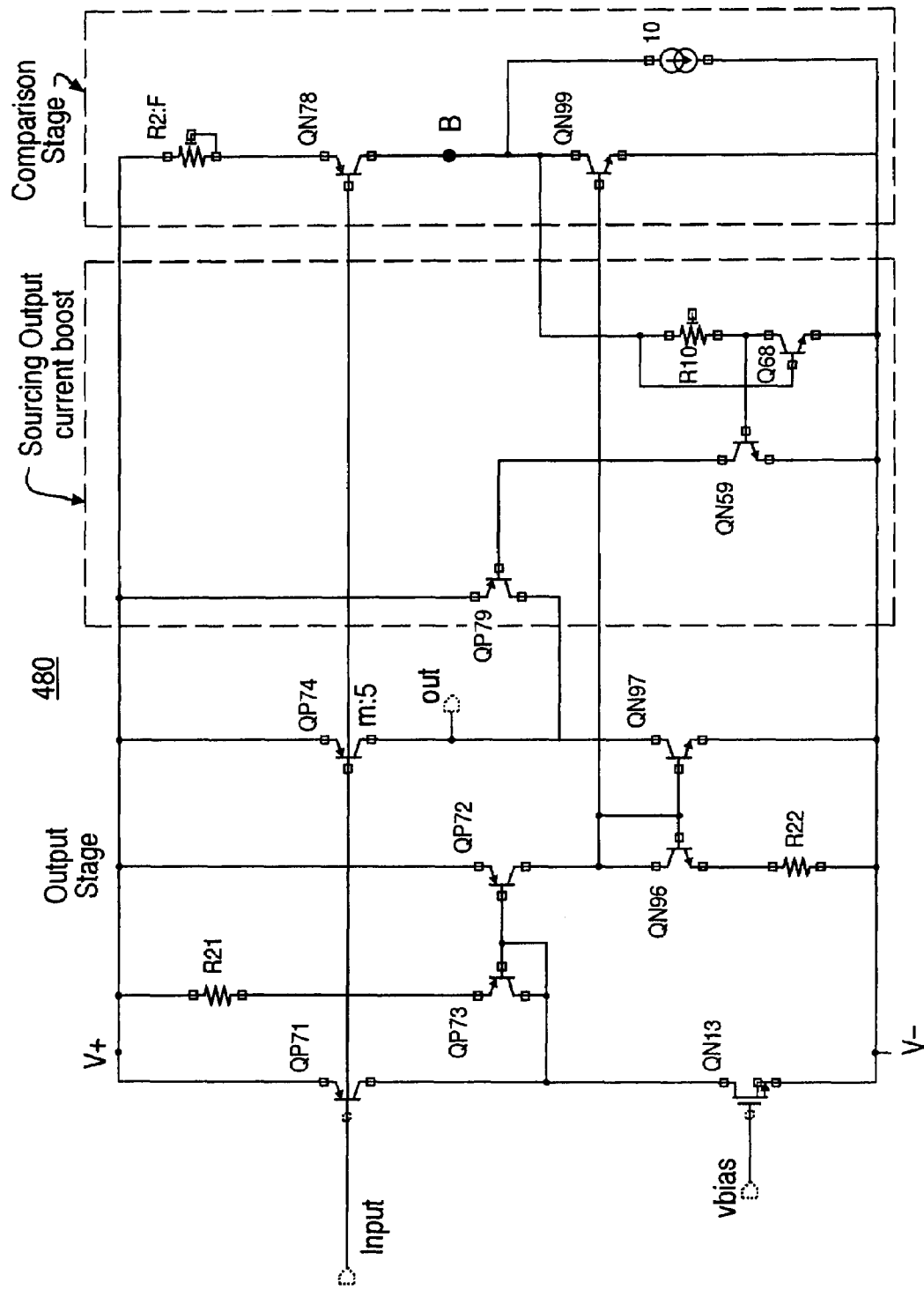
FIG. 4B is a schematic diagram of a circuit that is operative to provide a current source boost, in accordance with an embodiment of the present invention.

FIG. 4B is a schematic diagram of a circuit 480 that is operative to provide a current source boost, in accordance with an embodiment of the present invention. The output stage is similar to the output of the embodiment depicted in FIG. 4A. The comparison stage, however, is different in several respects. Transistor QP78 mirrors a fraction of the current from output transistor QP74 by being sized smaller and having degenerate resistor R27 coupled from its emitter to the upper voltage source. Transistor QN99 mirrors a fraction of the current from output transistor QN97 by being sized smaller than the output transistor QN97.

The collector of QP78 is coupled in series with the collector of transistor QN99 to allow QP78 and QN99 to form a comparison stage that controls a current boost stage formed by transistors QN68 and QN69 and resistor R10. Furthermore, a constant current source is coupled in series with QP78 and in parallel with QN99, such that the constant current source can receive current from QP78. Thus, the constant current source also affects the point at which the current boost stage is activated.

The combination of the constant current source and sense transistor QN99 may be designed to carry a larger current than sense transistor QP78 at quiescence (e.g., when the output transistors QP74 and QN97 have the same current). Thus, under quiescent conditions, this combination may be greater than the collector current of transistor QP78. This means that node B tends to go low at or near quiescence and the current source boost stage formed by transistors QN68 and QN69 and resistor R10 is not active. If desired sense transistor QN99 may mirror a higher fraction of the current from output transistor QN97 than the fraction of the output current from QP74 that is mirrored by sense transistor QP78. However, this is not required due to the constant current source, which also affects the point at which the current boost stage is activated.

When the output stage is sourcing a current, the current in transistor QP74 will be greater than the current in output transistor QN97 in order to satisfy the load requirement. As previously discussed, the combination of the constant current source and the current in sense transistor QN99 may be greater than the collector current of sense transistor QP78 at quiescent conditions. If the current of output transistor QP74 is greater than the current of output transistor QN97 by a large enough margin, then the current in sense transistor QP78 will be greater than the sum of the collector current of sense transistor QN99 and the constant current source IO. This excess current activates the sourcing current stage. The point at which this occurs depends on the ratio of output transistor QP74 to sense transistor QP78 factoring in degeneration resistor R27 compared to the ratio of output transistor QN97 to sense transistor QN99. This point also depends on the magnitude of the constant current source.

The current source boost stage operates as follows. The collector of boost transistor QP79 supplies a current source boost to the output stage. In this case, the boost current is provided by an element (QP79) in parallel with the output transistor QP74. The current source boost stage is activated by excess current from the collector of sense transistor QP78 flowing into the series combination of R121 and QN68 in the source boost stage.

The current source boost stage is a peaking current source in this embodiment such that the positive feedback loop is controlled. The base of boost transistor QP79 is coupled to the collector of QN69 in the peaking boost stage to control the sourcing current boost. The collector current of QN69 is a peaking current to limit the sourcing boost current. The current of QN69 will increase at first as current at its base increases. However, the current of transistor QN69 will peak and then decrease with further increases in its input current. Thus, as the excess current from sense transistor QP78 grows, at some point the sourcing current decreases.

To further aid in circuit stability the sense transistors QP78 and QN99 are coupled to the input stage. This allows these transistors to sense the input and increase their respective currents to stop the boosting current to get out of a condition in which the circuit is stuck at one extreme or the other.

Figure 5:
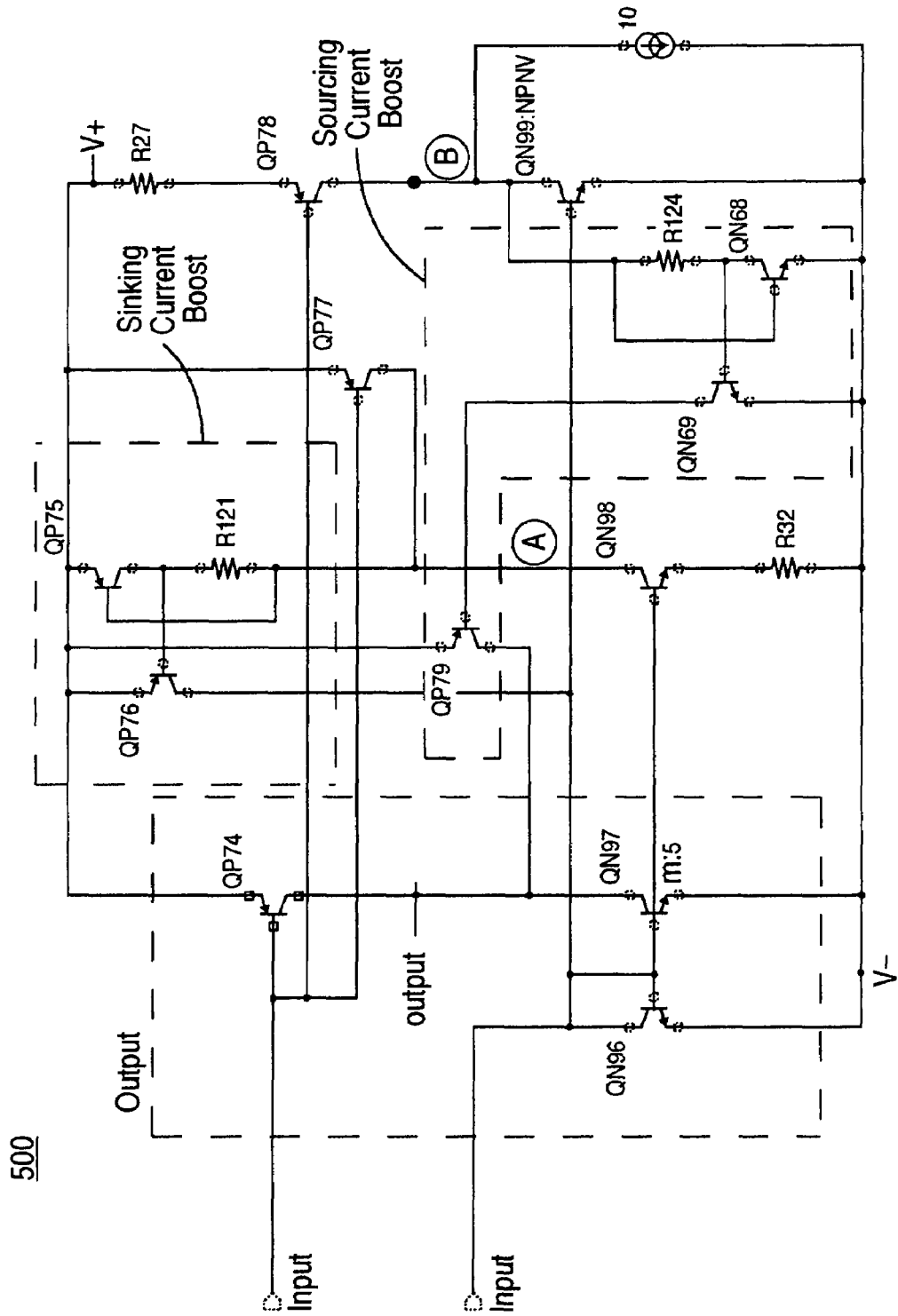
FIG. 5 is a schematic diagram of a circuit that is operative to provide a current boost, in accordance with an embodiment of the present invention.

FIG. 5 is a schematic diagram of a circuit 500 that is operative to provide both a current sink and a current source boost, in accordance with an embodiment of the present invention. Because elements and operation of the embodiment depicted in FIG. 5 are similar to the embodiments depicted in FIG. 4A and FIG. 4B, the embodiment of FIG. 5 will not be discussed in detail.

The embodiment of FIG. 5 comprises an output stage, a sinking current boost stage, and a sourcing current boost stage. Each of the boost stages has elements to limit the boost current. Elements to sense and compare the output currents are also depicted, in a similar fashion as the embodiments in FIGS. 4A-4B.

Thus, the embodiments herein depict that a current boost may be provided to a voltage driven device or a current drive device. The boost may be a sinking or sourcing boost in either case. Furthermore, the current boost may be provided by causing an output device whose output current is being sampled to boost its current. Alternatively, the current boost may be provided via an element in parallel with the output device whose current is being sampled to determine the need for a current boost. Regardless of the method of providing the current boost, it may be a sinking or sourcing boost. It will also be appreciated that although embodiments of the present invention depict bipolar devices, the present invention is not so limited. For example, embodiments of the present invention are well suited for field effect devices. Moreover, the present invention is not limited to the exemplary common-emitter configurations depicted herein.

Figure 6A:
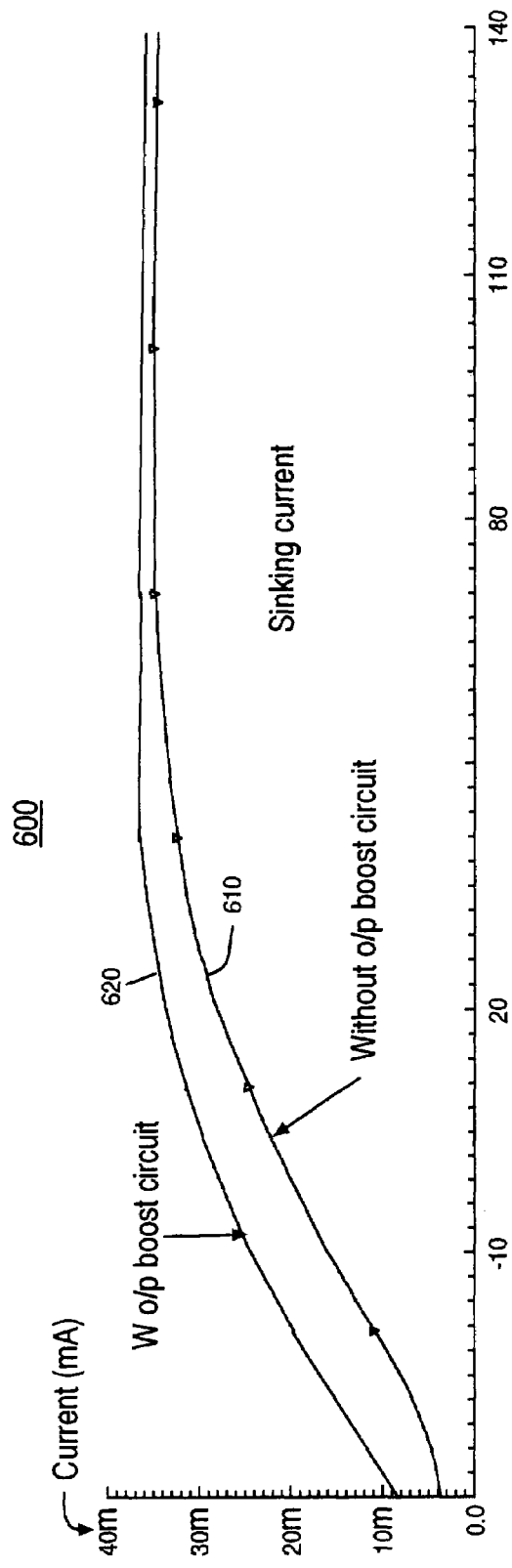
FIG. 6A is a graph illustrating a curve of sinking current versus temperature for a conventional device compared with a curve of sinking current versus temperature for a device in accordance with an embodiment of the present invention.

FIG. 6A is a graph 600 illustrating a curve 620 of sinking current versus temperature for a conventional device compared with a curve 610 of sinking current versus temperature for a device in accordance with an embodiment of the present invention. The curves are for 1.8 Volt supply voltage (total positive to negative). The embodiment of the present invention is able to sink more current than the conventional circuit at all temperatures depicted (−40 to 140 degrees Celsius). At 40 degrees Celsius the conventional circuit is only able to sink about 2 mA of current, whereas the embodiment of the present invention is able to sink about 8 mA.

Figure 6B:
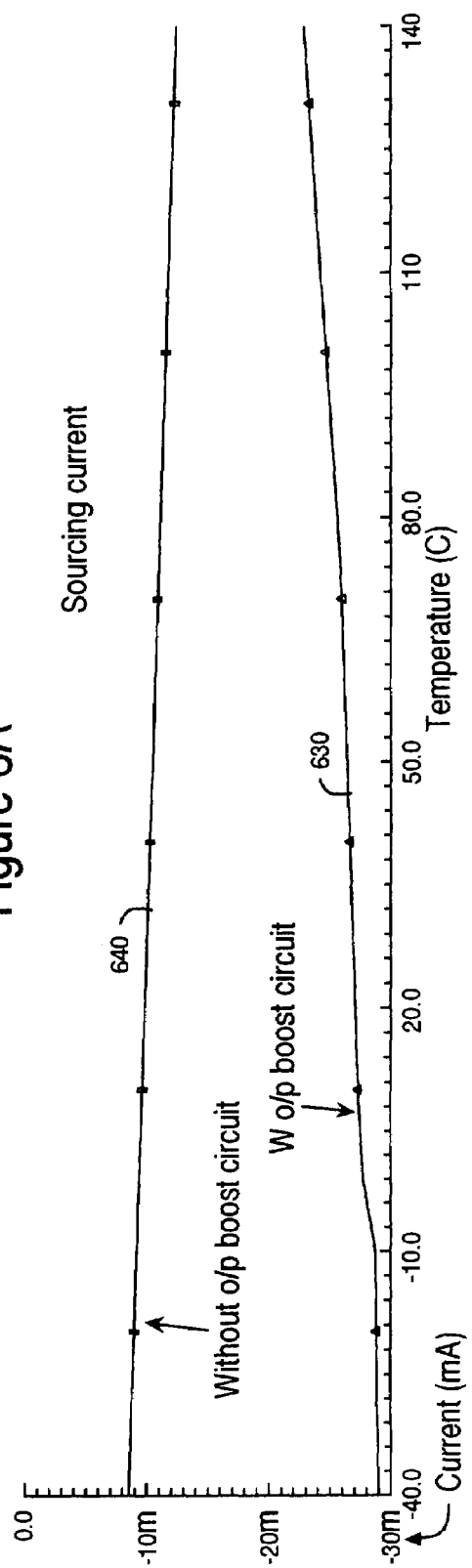
FIG. 6B is a graph illustrating a curve of sourcing current versus temperature for a conventional device compared with a curve of sourcing current versus temperature for a device in accordance with an embodiment of the present invention.

FIG. 6B is a graph 650 illustrating a curve of sourcing current versus temperature for a conventional device compared with a curve of sourcing current versus temperature for a device in accordance with an embodiment of the present invention. The embodiment of the present invention is able to source more current than the conventional circuit at all temperatures depicted (−40 to 140 degrees Celsius). The amount of current boost can be increased or decreased from the results produced in FIG. 6A and FIG. 6B by selection of device sizes.

Figure 7:
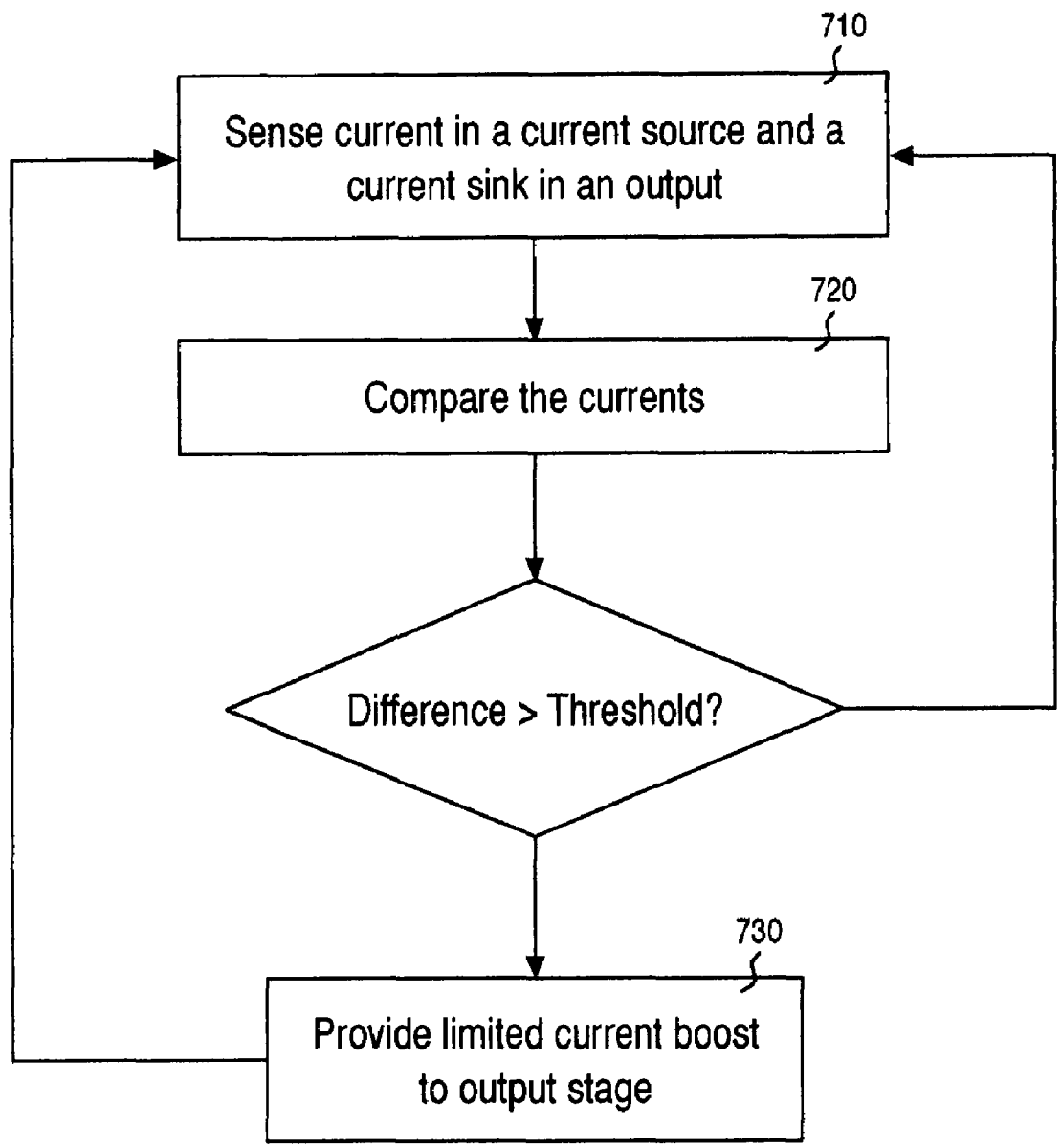
FIG. 7 is a flowchart illustrating steps of a process of providing a current boost, in accordance with an embodiment of the present invention.

FIG. 7 illustrates a method of providing a current boost, in accordance with an embodiment of the present invention. Steps of process 700 are illustrated sequentially, although those of ordinary skill in the art will appreciate that various steps may occur simultaneously. Step 710 is sensing a current in a current source and a current sink of an output stage.

Step 720 is comparing the currents to determine a difference therebetween. The compared currents may be fractional versions of the output currents, wherein the fractions are difference from each other. The comparison may serve to determine which of the current sink and current source could benefit from a current boost.

Step 730 is providing a limited current boost to the output stage if the difference crosses a threshold. The current boost may be a limited current sink boost or a limited current source boost. By a limited boost it is meant that the current boost is not allowed to continue to grow regardless of the result of the comparison. The process 700 continues to sense the currents in the output stage and adjust the boosting current appropriately.

Therefore, it will be seen that embodiments of the present invention provide a method and circuit for a current boost. Embodiments of the present invention are compatible with and can be fabricated economically with existing semiconductor fabrication techniques.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of providing a current boost, said method comprising:
    comparing a first current mirrored from a current source in an output stage with a second current mirrored from a current sink in said output stage to determine a difference between said first current and said second current, wherein said first current is a first fraction of a current from said current source and said second current is a second fraction of a current from said current sink, wherein said first fraction is different from said second fraction; and
    providing a limited current boost to said output stage if said difference exceeds a threshold.

2. A method as recited in claim 1 wherein said limited current boost is a limited current sink boost.

3. A method as recited in claim 1 wherein said limited current boost is a limited current source boost.

4. A method as recited in claim 1 wherein said providing comprises causing said current source to increase current output.

5. A method as recited in claim 1 wherein said providing comprises providing a current boost via an element in parallel with said current source.

6. A method as recited in claim 1 wherein said providing comprises causing said current sink to increase current output.

7. A method as recited in claim 1 wherein said providing comprises providing a current boost via an element in parallel with said current sink.

8. A circuit that provides a current boost, said circuit comprising:
    an output stage comprising a current source and a current sink;
    a comparison stage operable to compare a first current mirrored from said current source with a second current mirrored from said current sink to determine a difference between said first current and said second current, wherein said first current is a first fraction of a current from said current source and said second current is a second fraction of a current from said current sink, wherein said first fraction is different from said second fraction; and
    a current boost stage that is operable to provide a limited current boost to said output stage if said difference exceeds a threshold.

9. A circuit as recited in claim 8 wherein said current boost stage is operable to provide a current sink boost.

10. A circuit as recited in claim 8 wherein said current boost stage is operable to provide a current source boost.

11. A circuit as recited in claim 8 wherein said comparison stage comprises an offset element operable to offset said threshold.

12. A circuit as recited in claim 11 wherein said offset element comprises a current source.

13. A circuit that provides a current boost using positive feedback, said circuit comprising:
    an output stage comprising a current sourcing transistor operable to provide a source current and a current sinking transistor operable to provide a sink current;
    a comparison stage operable to determine whether a first current mirrored from said source current is larger than a second current mirrored from said sink current by a first margin and further operable to determine whether a third current mirrored from said sink current is larger than a fourth current mirrored from said source current by a second margin, wherein said first current is a first fraction of a current from said source current, said second current is a second fraction of a current from said sink current, said third current is a third fraction of a current from said source current and said fourth current is a fourth fraction of a current from said sink current, and wherein said first fraction is greater than or equal to said second fraction and wherein said third fraction is greater than said fourth fraction; and
    a current boost stage that is operable to provide a limited source current boost to said output stage if said first margin is exceeded and a limited sink current boost to said output stage if said second margin is exceeded, wherein said circuit employs positive feedback that is controlled by limiting said source current boost and said sink current boost.

14. A circuit as recited in claim 13 wherein said current boost stage provides said limited source current boost to said output stage via an element in parallel to said current sourcing transistor.

15. A circuit as recited in claim 13 wherein said current boost stage provides said limited sink current boost to said output stage via an element in parallel to said current sinking transistor.

16. A circuit as recited in claim 13 wherein said current boost stage causes said current sourcing transistor to increase current output in order to provide said source current boost.

17. A circuit as recited in claim 13 wherein said current boost stage causes said current sinking transistor to increase current in order to provide said sink current boost.

18. A circuit as recited in claim 13 wherein said current sourcing transistor and said current sinking transistor comprise a common-emitter configuration.

* * * * *